United States Patent
Kuroda et al.

(10) Patent No.: US 7,041,981 B2
(45) Date of Patent: May 9, 2006

(54) IMAGE SENSOR AND MANUFACTURING METHOD THEREOF

(75) Inventors: Yoshikatsu Kuroda, Komaki (JP); Tadayuki Takahashi, Sagamihara (JP)

(73) Assignees: Mitsubishi Heavy Industries Ltd., Tokyo (JP); Japan Aerospace Exploration Agency, Chofu (JP)

( * ) Notice: Subject to any disclaimer, the term of this patent is extended or adjusted under 35 U.S.C. 154(b) by 0 days.

(21) Appl. No.: 10/871,029

(22) Filed: Jun. 21, 2004

(65) Prior Publication Data
US 2004/0232346 A1 Nov. 25, 2004

Related U.S. Application Data

(60) Division of application No. 10/318,122, filed on Dec. 13, 2002, which is a continuation of application No. PCT/JP02/01919, filed on Mar. 1, 2002.

(30) Foreign Application Priority Data
Mar. 1, 2001 (JP) .............................. 2001-057346

(51) Int. Cl.
*G01T 1/24* (2006.01)
(52) U.S. Cl. .............................. 250/370.08; 250/370.13
(58) Field of Classification Search .......... 250/370.13, 250/370.08, 370.09, 370.12; 438/57, 73
See application file for complete search history.

(56) References Cited

U.S. PATENT DOCUMENTS

| | | | | |
|---|---|---|---|---|
| 5,448,055 A | * | 9/1995 | Nakamura et al. | 250/208.1 |
| 5,701,011 A | * | 12/1997 | Ohmori et al. | 250/370.09 |
| 5,723,866 A | | 3/1998 | Hamilton, Jr. | |
| 5,812,191 A | | 9/1998 | Orava et al. | |
| 5,952,646 A | * | 9/1999 | Spartiotis et al. | 250/208.1 |
| 6,342,700 B1 | | 1/2002 | Izumi et al. | |
| 6,348,399 B1 | * | 2/2002 | Lin | 438/616 |
| 6,510,195 B1 | * | 1/2003 | Chappo et al. | 250/370.09 |
| 6,528,796 B1 | * | 3/2003 | Kaifu et al. | 250/370.11 |
| 6,593,168 B1 | * | 7/2003 | Ehrichs et al. | 438/108 |
| 6,651,320 B1 | * | 11/2003 | Yagi et al. | 29/840 |
| 2004/0232346 A1 | | 11/2004 | Kuroda et al. | |

FOREIGN PATENT DOCUMENTS

EP 0745 869 12/1996

(Continued)

OTHER PUBLICATIONS

U.S. Appl. No. 11/073,730, filed Mar. 8, 2005, Kuroda, et al.

*Primary Examiner*—Albert Gagliardi
(74) *Attorney, Agent, or Firm*—Oblon, Spivak, McClelland, Maier & Neustadt, P.C.

(57) ABSTRACT

An image sensor has a three-dimensional structure in which a sensor element array having a plurality of sensor elements consisting of CdTe, arranged in a two-dimensional matrix, is mounted to an IC substrate via a connection layer. The connection layer has a plurality of stud bumps and a plurality of thin film layers. The stud bumps are formed on an electrode of each IC and are provided in the connection layer in order to fetch a signal detected by each sensor element. The thin film layers are formed at the distal end of each stud bump, and are electrically connected with an electrode of each sensor element.

4 Claims, 6 Drawing Sheets

FOREIGN PATENT DOCUMENTS

| | | |
|---|---|---|
| JP | 10-22337 | 1/1996 |
| JP | 8-115946 | 5/1996 |
| JP | 8-213425 | 8/1996 |
| JP | 8-322826 | 12/1996 |
| JP | 10233401 A * | 9/1998 |
| JP | 2000-100874 | 4/2000 |

* cited by examiner

IMAGE SENSOR AND MANUFACTURING METHOD THEREOF

CROSS-REFERENCE TO RELATED APPLICATIONS

This is a Continuation Application of PCT Application No. PCT/JP02/01919, filed Mar. 1, 2002, which was not published under PCT Article 21(2) in English.

This application is based upon and claims the benefit of priority from the prior Japanese Patent Application No. 2001-057346, filed Mar. 1, 2001, the entire contents of which are incorporated herein by reference.

BACKGROUND OF THE INVENTION

1. Field of the Invention

The present invention relates to an image sensor, which detects radiation, and to a method of manufacturing image sensors.

2. Description of the Related Art

An image sensor, which detects radiation such as hard X-rays or γ-rays so as to generate image information, has been used in various technical fields. For example, a radiant field from a certain celestial body is detected, and thereby, it is possible to know the physical status of the celestial body and the spatial structure thereof. Further, X-rays are irradiated to a human body, and then, the transmitted wave is investigated, and thereby, tomography of the human body can be obtained. Besides, the image sensors have also been used in other fields, such as nuclear power (glass solidification check of radioactive waste, radiation monitor, etc.), non-destructive tests (semiconductor tester, etc.) and mineral surveying (mineral resources research).

The image sensor conventionally used for the above fields has the following structure, for example.

Figure 1A:
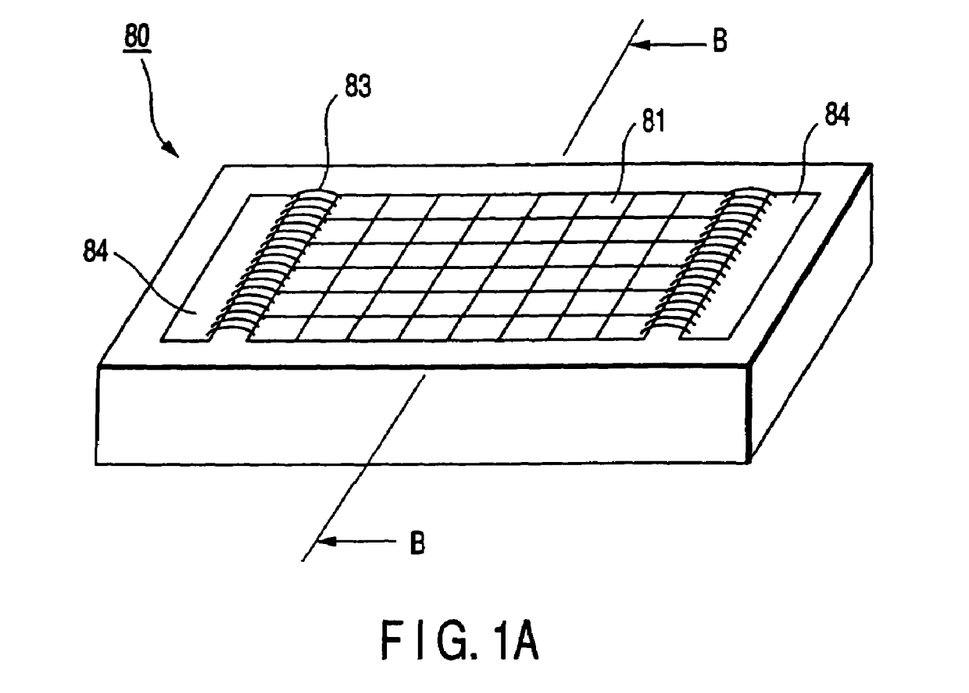
FIG. 1A and FIG. 1B are views to explain a conventional image sensor.
Figure 1B:
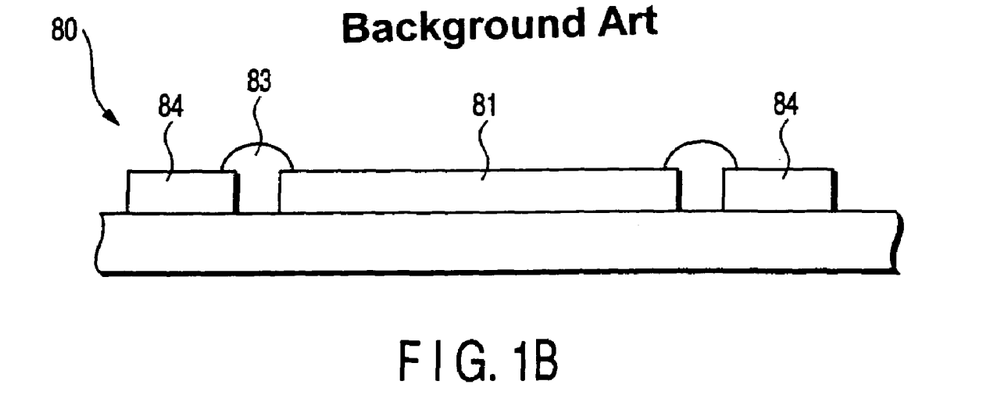

FIG. 1A is a view showing a typical example of the above conventional image sensor 80, and FIG. 1B is a cross-sectional view taken along the B—B direction of FIG. 1A. As shown in FIG. 1A and FIG. 1B, the image sensor 80 has a detecting element (Si element or Ge element) 81, and an amplifying IC 84. More specifically, the detecting element 81 detects incident radiation so as to generate an electric signal. The amplifying IC 84 is arranged on the same plane as the detecting element 81, and amplifies the electric signal. In the image sensor 80, an interconnection line 83 led out of the detecting element 81 is connected to the amplifying IC 84 by wire bonding.

In general, according to the above structure in which the detecting element and the amplifying IC are arranged on the same plane and mutually connected, it is difficult to greatly increase the number of the detecting elements 81 of the image sensor. The reason is because it is technically difficult to further lead many signal lines out of the peripheral region of the detecting element 81 by wire bonding.

The image sensor using the Si element detects only X-rays having a low energy from several KeV to tens of KeV; for this reason, the image sensor does not have the sensitivity required for practical use.

As typified by the CCD, the recent visible sensor technique has been specialized in slowly reading two-dimensional information under the condition that a signal to noise ratio is very good. However, in photons other than the visible light region, environmental noise is high and signals are weak; for this reason, high-speed operation and high-reduction of noise are required as not so compared with the case of detecting the visible light. As a result, there is a need of connecting a read circuit to each one of fine pixels, and the development of a high-speed parallel readable system has been required.

It has been known that silicon becomes transparent with respect to hard X-rays or γ-rays having a wave-length shorter than soft X-rays. Therefore, in order to obtain the large stopping power, the development of a new CdTe semiconductor must progress quickly.

The present invention has been made in view of the above circumstances. Accordingly, it is an object to provide a highly sensitive image sensor, which can readily make an electric connection between each sensor element and an amplifying IC even if it has many sensor elements, and to provide a method of manufacturing the image sensor.

BRIEF SUMMARY OF THE INVENTION

In order to achieve the above object, the present invention has taken the following means.

According to a first aspect of the present invention, there is provided an image sensor which comprises: a sensor element array having a plurality of sensor elements arrayed in a two-dimensional matrix; an IC substrate laminating the sensor element array and provided with a plurality of ICs for amplifying an electric signal based on radiation incident on any of the plurality of the sensor elements; and a connection layer interposed between the sensor element array and the IC substrate, and electrically connecting each electrode of the sensor elements with each electrode of the ICs.

According to a second aspect of the present invention, in the image sensor of the first aspect, the connection layer has a plurality of stud bumps formed on the electrode of each IC; and a plurality of thin film layers formed at the distal end of each stud bump and electrically connected with the electrode of each sensor element.

According to a third aspect of the present invention, in the image sensor of the second aspect, each of the stud bumps is made of gold; and each of the thin film layers is made of indium.

According to a fourth aspect of the present invention, in the image sensor of the second aspect, the connection layer has an insulating layer which buries the stud bumps and the thin film layers.

According to a fifth aspect of the present invention, in the image sensor of the first aspect, the connection layer has a plurality of multi-layer bumps formed in a manner that at least two-layer stud bump is laminated on the electrode of each IC, and a plurality of thin film layers formed at the distal end of the multi-layer bump and electrically connected with the electrode of each sensor element.

According to a sixth aspect of the present invention, in the image sensor of the fifth aspect, each of the multi-layer bumps is made of gold; and each of the thin film layers is made of indium.

According to a seventh aspect of the present invention, in the image sensor of the fifth aspect, the connection layer has an insulating layer which buries the stud bumps and the thin film layers.

According to an eighth aspect of the present invention, in the image sensor of the first aspect, the sensor element is a CdTe element.

According to a ninth aspect of the present invention, there is provided a method of manufacturing an image sensor which comprises: forming a stud bump on each electrode pad of the predetermined number of IC chips provided in a first substrate; carrying out indium plating with respect to a second substrate; transferring the plated indium to the second substrate to the distal end of each stud bump so that a plurality of thin film layers can be formed; connecting each of the thin film layers with the electrode of the sensor element so that a sensor element array having a plurality of sensor elements arrayed like two-dimensional matrix is mounted to each IC of the first substrate by flip chip mounting; and injecting an insulating resin between the first substrate and the sensor element array, and thereafter, hardening the insulating resin.

According to a tenth aspect of the present invention, in the method of the ninth aspect, each of the stud bumps is made of gold, and each of the thin film layers is made of indium.

Therefore, according to the above structure, even if the image sensor has many sensor elements, it is possible to provide a high-sensitive image sensor, which can readily make electric connection between each sensor element and amplification IC, and to provide a method of manufacturing the image sensor.

DETAILED DESCRIPTION OF THE INVENTION

The embodiments of the present invention will be described below with reference to the accompanying drawings. In the following description, the identical reference numerals are given to constituent components having substantially the same function and structure, and the overlapping explanation will be made in only necessary case.

The image sensor 10 of the embodiment is formed in a manner of mounting a sensor element array on the IC substrate mounted with the amplifying IC according to flip chip mounting (hereinafter, referred to as "FC mounting") by the stud bump process described later. The sensor element array is formed by arranging a plurality of sensor elements made of CdTe (cadmium telluride) in a matrix. The structure of the sensor element array and the IC substrate will be described below with reference to FIG. 1 to FIG. 3.

Figure 2A:
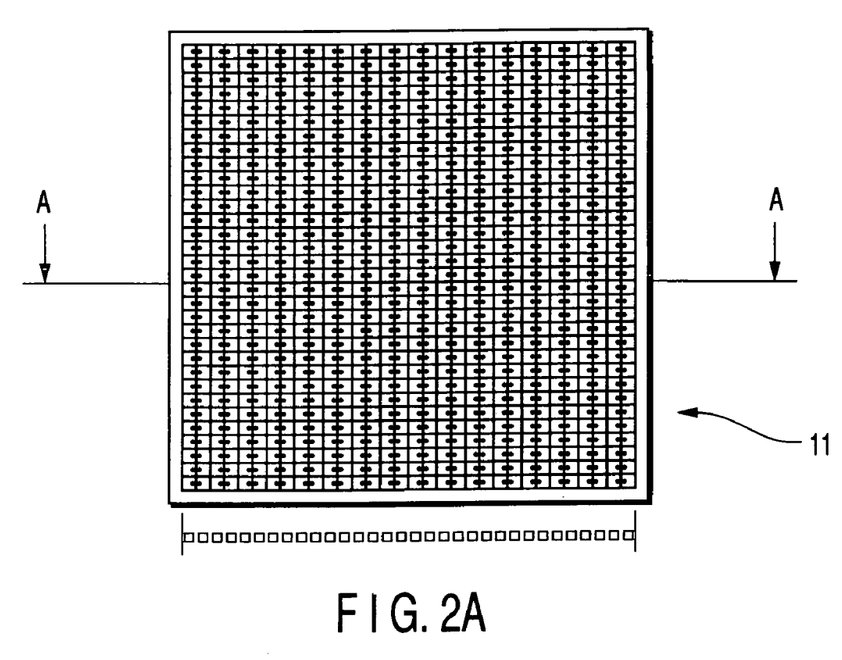
FIG. 2A and FIG. 2B are views to schematically explain the structure of an image sensor 10.
Figure 2B:
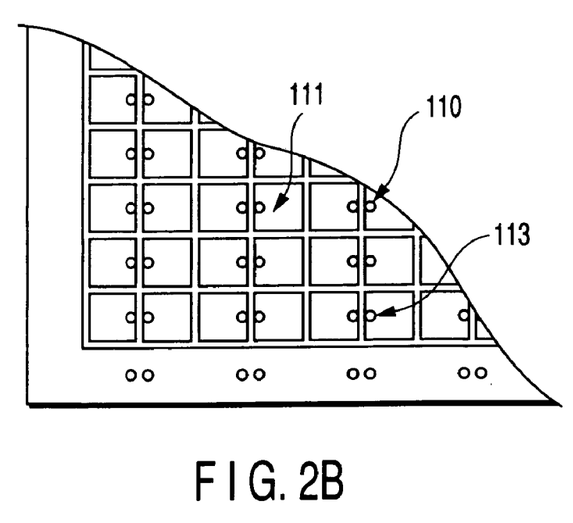

FIG. 2A and FIG. 2B are views to schematically explain the structure of the image sensor 10. FIG. 2A is a view showing an upper surface of the image sensor 10 (and an upper surface of the sensor element array 11). FIG. 2B is an enlarged view showing a portion surrounded by a circle shown in FIG. 2A.

Figure 3A:
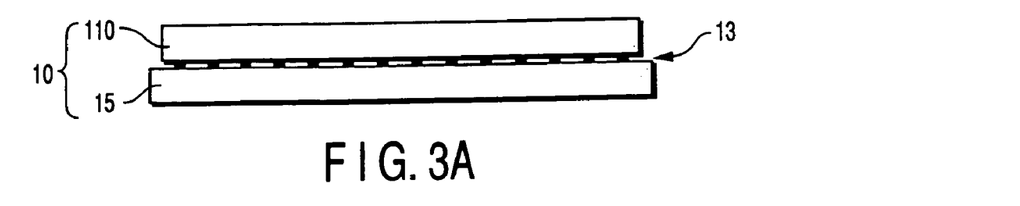
FIG. 3A to FIG. 3C are cross-sectional views taken along the line A—A of the image sensor shown in FIG. 2A.

FIG. 3A is a cross-sectional view taken along the line A—A of the image sensor 10 shown in FIG. 2A.

As is illustrated in FIG. 2A and FIG. 3A, the sensor element array 11 has a CdTe element 110, a first electrode 111, a second electrode 112, and an active contact 113.

The CdTe element 110 is a compound semiconductor consisting of Cd (cadmium) and Te (tellurium). The energy gap of the CdTe element 110 is about 1.47 eV under room temperature.

The first electrode 111 is arrayed like two-dimensional matrix on the radiation incident side of the CdTe element 110, and is formed of Pt, for example. The second electrode 112 is arrayed on an electric signal fetch side of the CdTe element 110 facing the first electrode 111 via the CdTe element 110, and is formed of Pt, for example. A predetermined voltage for detecting radiation is applied between the first and second electrodes 111 and 112.

More specifically, the sensor element array 11 is formed in the following manner. The sensor element is formed in a manner of sandwiching the CdTe element 110 between the first and second Pt electrodes 111 and 112, and thereafter, in a two-dimensional matrix. When radiation is incident on a depletion layer formed by applying the voltage between the first and second Pt electrodes 111 and 112, many electrons and holes are generated along the track of radiation. Positive and negative charges are fetched as an electric signal, and thereby, the sensor array element 11 generates image information based on the incident radiation.

The active contact 113 is formed in the first and second electrodes, and is a pad for flip-chip-mounting the sensor array element 11 on the IC substrate 15 by the stud bump process described later. The electric signal detected by each sensor element is inputted to the IC from the active contact 113 via a stud bump described later, thereafter, is subjected to predetermined signal processing such as amplification.

Figure 4A:
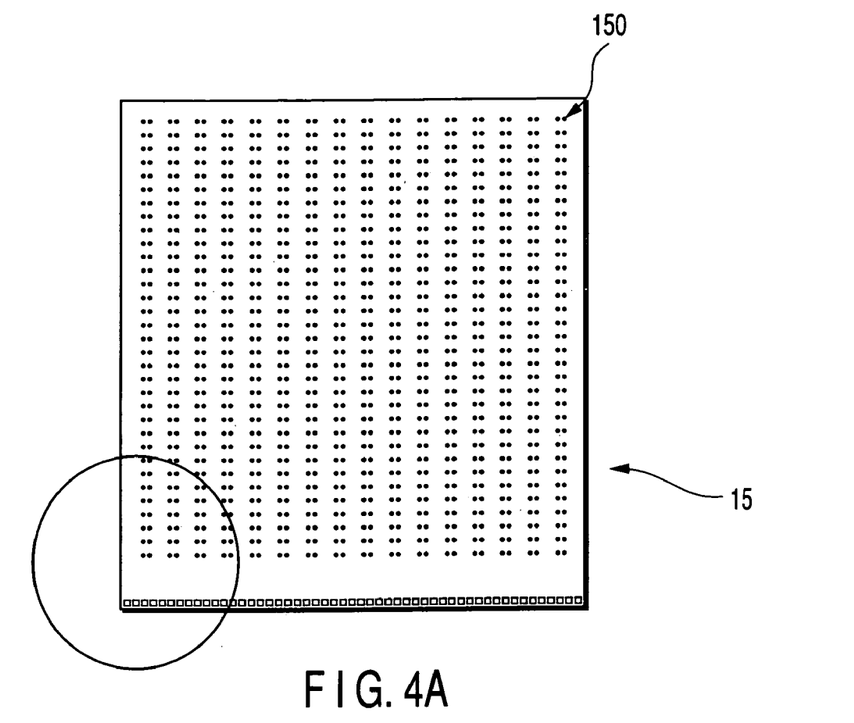
FIG. 4A and FIG. 4B are views to schematically explain the structure of an IC substrate included in the image sensor 10.
Figure 4B:
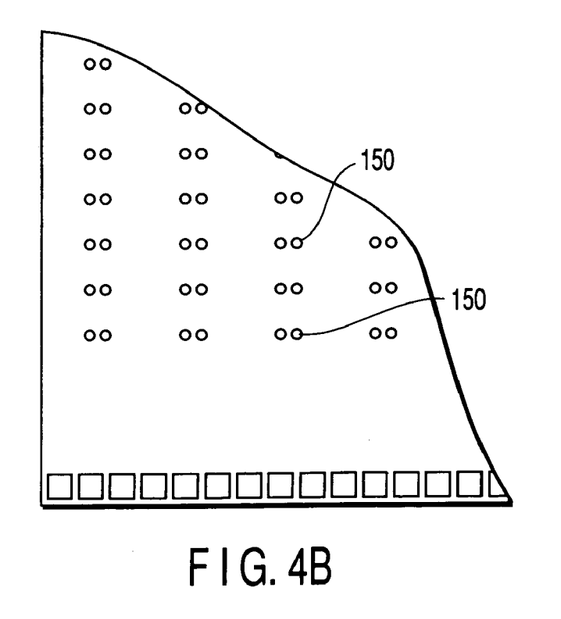

FIG. 3 is a view to schematically explain the structure of the IC substrate 15 included in the image sensor 10. FIG. 4A is a view showing an upper surface of the IC substrate 15, and FIG. 4B is an enlarged view showing a portion surrounded by a circle shown in FIG. 4A.

As shown in FIG. 4A, in the IC substrate 15, a flip chip bump 150 (hereinafter, referred to as "FC pad") included in each of plural X-ray resistant ICs (not shown) is arrayed like two-dimensional matrix. The position of the FC pad 150 corresponds to that of the above active contact 113, and FC mounting is carried out based on both positions. A stud bump described later is formed on the FC pad 150.

Next, a connecting layer 13 formed between the image sensor 10 and the IC substrate 15 will be described below with reference to FIG. 3B and FIG. 3C.

Figure 3B:
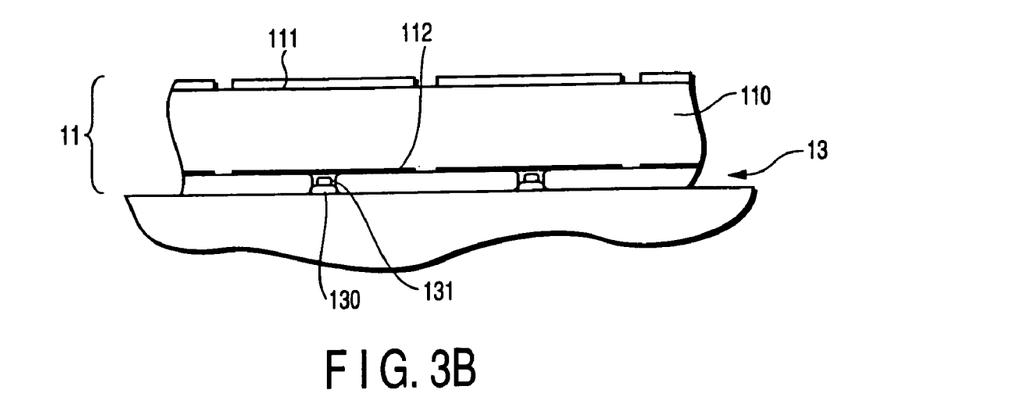
Figure 3C:
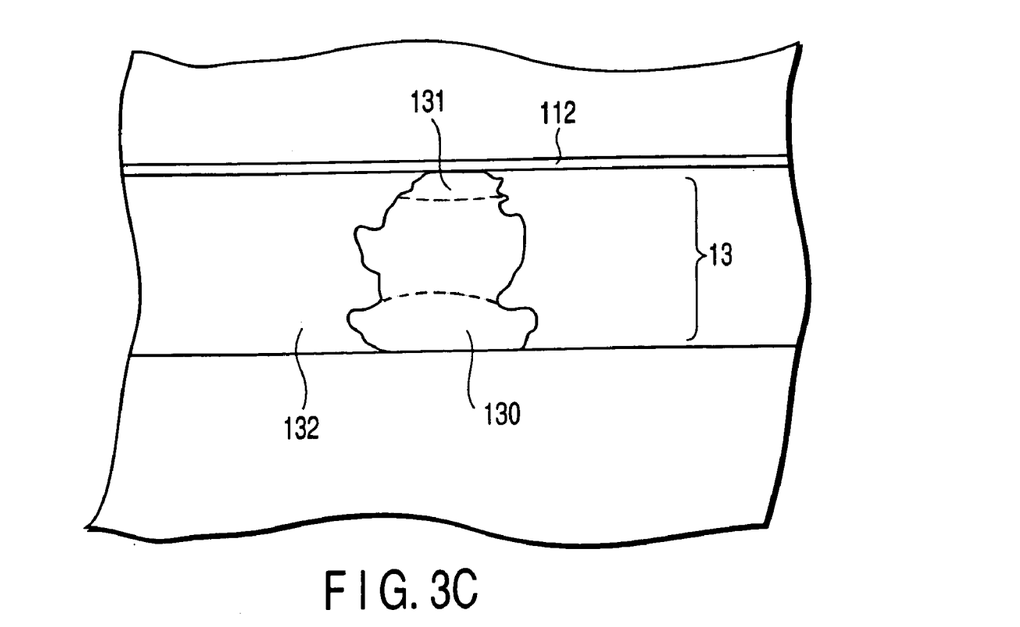

FIG. 3B and FIG. 3C are views to explain FC mounting of the image sensor 10 to the IC substrate 15. FIG. 3B is an enlarged view showing part of the connecting layer 13 shown in FIG. 3A.

As seen from FIG. 3B and FIG. 3C, the connecting layer 13 has a stud bump 130, an indium layer 131 formed at the distal end of the stud bump 130, and an insulating layer 132.

The stud bump 130 is formed on the FC pad 150 on each IC substrate 15, and is made of gold. The stud bump 130 is formed in a manner that a projection-shaped bump is laminated on the FC pad 150 in one or two-stage or more. The stud bump 130 performs the function of absorbing the current application between the sensor element and the IC, and a connection error in FC mounting described later. Therefore, it is preferable that the material used for the stud bump is a relatively soft metal having excellent conductivity.

The indium layer (In layer) 131 is a thin film layer, which is formed at the distal end of the stud bump 130. The indium layer 131 is formed into a tapered shape so as to have a predetermined height in the manufacturing stage (see FIG. 7). In FC mounting, the indium layer 131 is pressed and welded by the second electrode and the active contact 113, and thus, has a shape shown in FIG. 3C. Further, the indium layer 131 performs the function of applying a current between the sensor element and the IC, and providing a predetermined height required for FC mounting described later. Since the CdTe element is used in the embodiment, it is preferable that a solder having a melting point of 100° C. or less is used. For example, bismuth may be used in addition to indium.

The insulating layer 132 is a resin layer formed in underfill, and is formed of an epoxy resin, for example. Further, the insulating layer 132 performs the function of burying the stud bump 130 and the indium layer 131 so that they can be both electrically insulated and reinforced. The insulating layer 132 prevents the thermal stress generated by the difference in thermal expansion coefficient between the sensor element array 11 and the IC substrate 15 from concentrating on the stud bump 130 and the indium layer 131.

One of the features of the above image sensor 10 is that the sensor element array 11 and the IC substrate 15 are mounted in the laminated form by the connection layer 13, in particular, the stud bump 130 and the In layer 131. More specifically, in the conventional image sensor, the IC and the sensor element arrayed on the same plane are connected by wire bonding; a so-called "two-dimensional mounting mode" has been employed. On the contrary, in the image sensor 10, the sensor element array 11 is laminated on the IC substrate 15 by the stud bump 130 and the In layer 131; a so-called "three-dimensional mounting mode" is employed.

In the image sensor made employing the above three-dimensional mounting, IC connection is made from the lower portion of each sensor element. Therefore, even if the number of sensor elements increases, it is possible to easily extract signals. As a result, it is possible to generate an image having a great number of pixels as compared with the conventional case. Further, the three-dimensional mounting is employed, and thereby, it is possible to down-size the image sensor.

(Method of Manufacturing the Image Sensor)

Next, the method of manufacturing the image sensor 10 will be described below with reference to FIG. 5.

Figure 5:
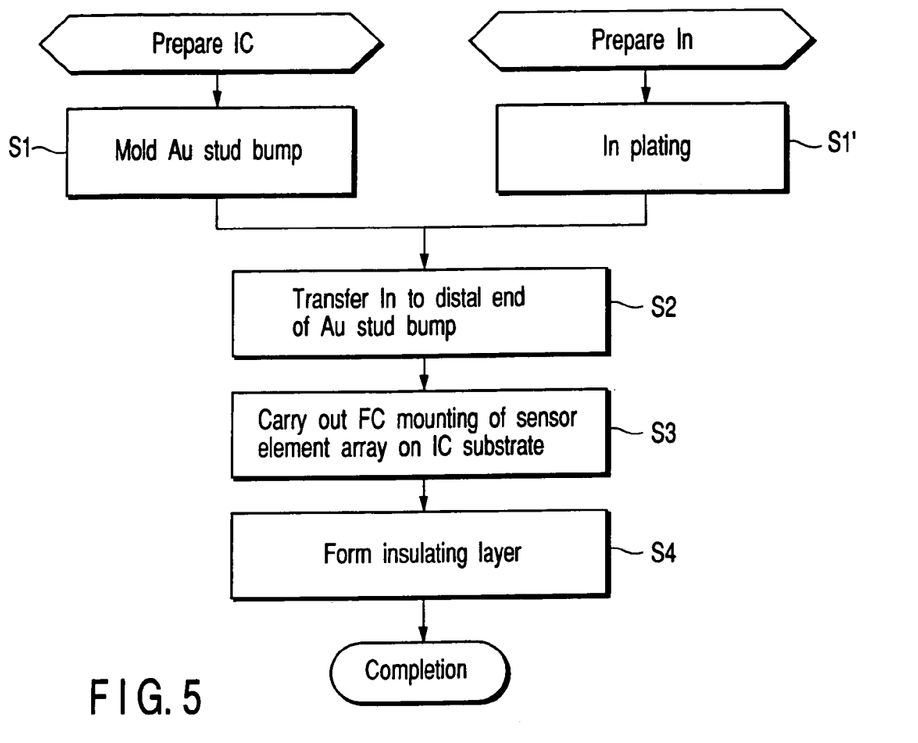
FIG. 5 is a flowchart schematically showing a method of manufacturing the image sensor 10.

FIG. 5 is a flowchart schematically showing the method of manufacturing the image sensor 10. In FIG. 5, first, the IC substrate 15 having the plurality of ICs arrayed in a predetermined form is prepared. A stub bump (hereinafter, referred to as "Au stud bump") using gold as the base material is molded on each flip chip pad 150 (step S1). As the need arises, there is the case where the au stub bump is formed in plural stages (i.e., the Au stud bump is laminated).

On the other hand, a stainless substrate is plated with indium (In) so as to form the transfer destination for indium (In) transfer to the distal end of the Au stud bump (step S1').

Sequentially, the indium (In) is transferred to the distal end of the Au stud bump (step S2). The transfer in step S2 is carried out in the following manner using an FC bonder.

Figure 6:
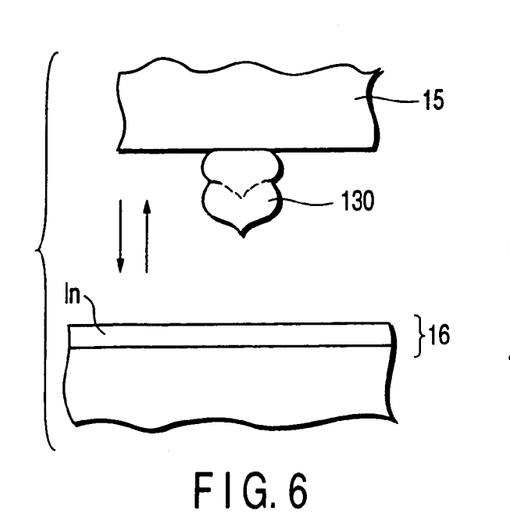
FIG. 6 is a conceptual view to explain indium (In) transfer in step S2.

FIG. 6 is a conceptual view to explain the indium (In) transfer in step S2. As is illustrated in FIG. 6, the IC substrate 15 with the Au stud bump 130 provided on the head side of the FC bonder (not shown) is pressed against a stainless substrate 16 plated with In. The above pressing operation is carried out under predetermined head temperature control, predetermined head speed and predetermined load control, and further, there is the case where the pressing operation is repeated plural times. After a predetermined pressing time elapses, when the head is pulled up under predetermined head temperature control, predetermined head speed and predetermined load control, the In transfer to the distal end of the Au stud bump 130 is completed.

Figure 7:
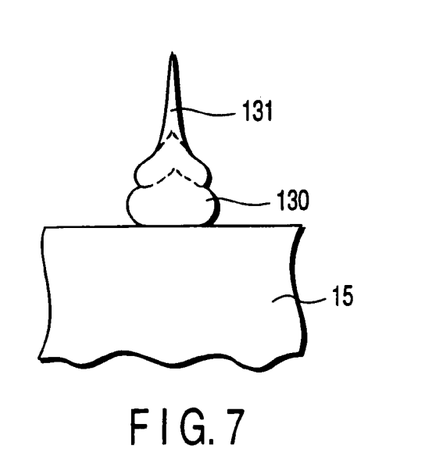
FIG. 7 is a schematic view showing an indium (In) layer 131 formed at the distal end of an au stud bump 130 formed in the process of step S2.

FIG. 7 is a view schematically showing the In layer 131 formed at the distal end of the Au stud bump 130 formed in the process of step S2. As is illustrated in FIG. 7, the In layer 131 formed in step S2 has a tapered shape and a predetermined height. Also, the shape of the Au stud bump 130 does not crush as shown in FIG. 3C.

Sequentially, FC mounting of the sensor element array 11 to the IC substrate 15 is carried out (step S3). More specifically, first, flattening is carried out with respect to the In layer 131 formed in step S2. This is to prevent an extra pressure from being applied to one point on the second electrode of the sensor element array 11 (in other words, pressure is uniformly applied to each second electrode 112). After the above flattening, the pressing/heating by the FC bonder destroys/melts an oxide film on the surface of each In layer 131 so that the In layer 131 can be welded to the corresponding second electrode 112, and thereby, FC welding is achieved between the sensor element array 11 and the IC substrate 15. In this case, no gap is generated between the second electrode 112 and the In layer 131 by the above press. Therefore, it is possible to prevent oxidation between the In layer and the second electrode in heating (i.e., the oxide film on the surface of each In layer 131 is destroyed/melted so that the In layer 131 can be welded to Pt on the electrode surface of the CdTe chip).

Finally, the insulating layer 132 is formed (step S4). More specifically, the underfill seals the gap (FC gap) between the sensor element array 11 and the IC substrate 15, which have been FC-connected in the process of step S3. Thereafter, the underfill is heated and hardened for a predetermined time so that the insulating layer 132 can be formed.

The above steps describe formation of the image sensor 10.

(Embodiment of the Manufacturing Method)

The embodiment of the manufacturing method will be described below in detail with reference to FIG. 8.

Figure 8:
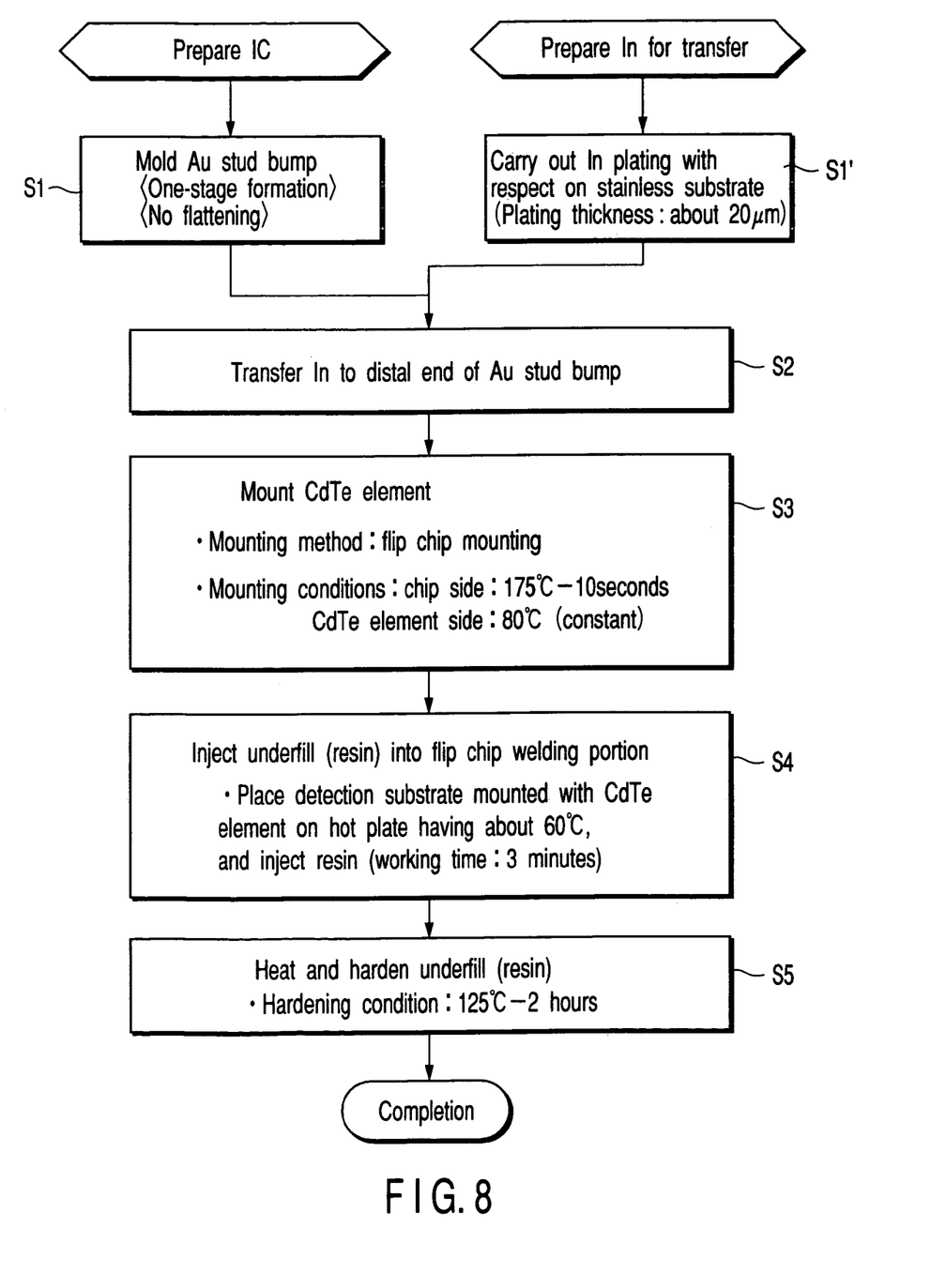
FIG. 8 is a flowchart showing the embodiment of the method of manufacturing the image sensor 10.

FIG. 8 is a flowchart showing the embodiment of the method of manufacturing the image sensor 10. In FIG. 8, first, the IC substrate 15 having the plurality of ICs arranged in a predetermined form is prepared. A stub bump (hereinafter, referred to as "Au stud bump") using gold as the base material is molded on each flip chip pad 150 (step S1).

On the other hand, the stainless substrate is plated with indium (In) to a thickness of 20 μm, and thus, the transfer destination for In transfer to the distal end of the Au stud bump is formed (step S1').

Sequentially, the indium (In) is transferred to the distal end of the Au stud bump (step S2). The transfer in step S2 is carried out in the following manner using an FC bonder.

More specifically, the IC substrate with the stud bump 150 is set to the head side of the FC bonder. On the other hand, the stainless substrate plated with indium (In) is set to the table side. In this case, the table temperature is kept at 50° C., for example. After the above setup is completed, the head is pulled down, and then, the distal end of each Au stud bump 130 can be pressed against the In plating layer of the stainless substrate two times. In this case, the first-time press is carried out under the following conditions. That is, the head is pressed at loading: 2.64 [kgf], pressing time: 11.0 sec., head temperature: 250° C., and head pull-down speed 0.2 [mm/s], and thereafter, pulled up by the height of 5 mm at the pull-up speed of 0.5 [mm/s] while maintaining the head temperature. Thereafter, the In plating layer is left to cool for 40 seconds, and then, the second-pressing is carried out under the following conditions. That is, the head is pressed at loading: 2.64 [kgf], pressing time: 5.0 sec., head temperature: 250° C., and head pull-down speed 0.2 [mm/s], and thereafter, pulled up by the height of 5 mm at the pull-up speed of 0.08 [mm/s] while maintaining the head temperature. The In transfer to the distal end of the Au stud bump 130 is then completed.

In the above In transfer, if the affinity between indium (In) and the stainless substrate is worse, the indium (In) of the stainless substrate is pressed against the Au stud bump so that the indium (In) can be heated/melted, and thereby, it is possible to effectively transfer the indium (In) to the au stud bump.

Sequentially, FC mounting of the sensor element array 11 to the IC substrate 15 is carried out (step S3).

More specifically, flattening is carried out with respect to the In layer 131 formed in step S2. After the flattening, the IC substrate 15 is set to the head side of the FC bonder; on the other hand, the sensor element array 11 is set to the table side. After the IC substrate 15 and sensor element array 11 are positioned, the head is pulled down under the following conditions, that is, at loading: 10.00 [kgf], head temperature: 175° C., pressing time: 10.0 sec., and head pull-down speed 0.08 [mm/s]. Thereafter, the head is pressed against the stud bump 130 and the active contact 113 of the In layer 131 under the following conditions. After the above press is completed, the head position is held for 1.0 second while maintaining the head temperature at 175° C. Thereafter, the head is pulled up by the height of 5 mm at the pull-up speed of 0.17 [mm/s] while keeping the head temperature at 175° C., and thereby, the sensor element array 11 and the IC substrate 15 can be FC-welded together. In step S3, the table temperature is kept at 80° C.

Finally, the insulating layer 132 is formed (step S4). First, on the hot plate, the sensor element array 11 is heated at a temperature from 60° C. to 80° C., and an epoxy resin is kept at a temperature from 25° C. to 40° C. The epoxy resin is injected into the FC gap formed in the process of step S3. In this case, care must be taken to prevent the sensor element array comprising CdTe and the FC welding portion separating. The heating temperature of the sensor element array 11 must be set so as not to exceed 80° C. If the temperature exceeds 80° C., the epoxy resin is set faster; as a result, injection is not smoothly achieved. The injection processing is carried out for about 3 minutes.

After the injection processing is completed, heating and hardening are carried out under the condition that the heating temperature is 125° C. and the heating time is two hours, and thereby, the insulating layer 132 is formed.

The above steps describe formation of the image sensor 10.

One of the features of the above manufacturing method is the Au stud bump 130 (plural-stage Au stud bump 130, as the case may be,) and the In layer 131 having a predetermined height, formed at the distal end of the Au stud bump 130. More specifically, the height of the In layer 131 further increases in addition to the height of the au stud bump 130. By doing so, it is possible to obtain a larger pressing width when pressure-welding the sensor element array 11 to the IC substrate 15 in FC welding. Further, the Au stud bump 130 absorbs the error in the height between bumps connected in FC welding. Therefore, according to the manufacturing method, it is possible to readily realize an image sensor having a great number of pixels.

Further, according to above manufacturing method, no special manufacturing apparatus is newly required, and it is possible to manufacture the image sensor 10 by applying presently available facilities. Therefore, the image sensor can be provided at low cost as compared with the conventional case.

Further, since the image sensor 10 uses the CdTe element, it is possible to provide a high-performance image sensor as compared with the conventional case.

The present invention has been described based on the embodiments. In the scope of the concept of the present invention, it should be also understood that various changes and modifications will readily occur to those skilled in the art, and therefore, these changes and modifications belong to the scope of the present invention. For example, the following various modifications may be made without departing from the scope of the general inventive concept.

In the above embodiment, the stud bump process has been described while giving the image sensor 10 using the CdTe element as one example. In this case, the stud bump process is applicable to the method of manufacturing the image sensors using the base materials other than CdTe as the sensor element; for example, Si, Ge, CdZnTe or HgCdTe (mercury cadmium telluride).

The present invention is not limited to the above embodiment, and various modifications may be made without departing from the scope of the general inventive concept in the working stage of the invention. Each embodiment may be carried out based on proper combinations as much as possible; in this case, combined effects are obtained. Further, the above embodiment includes various-step inventions, and the plurality of constituent requirements disclosed is properly combined, and thereby, various inventions can be extracted. For example, even if some constituent requirements are deleted from all constituent requirements disclosed in the embodiment, it is possible to solve the problem described in the column of the problem that the invention is to solve. When at least one of the effects described in the column of the effects of the invention is obtained, the construction in which the constituent requirements is deleted can be extracted as an invention.

According to the above structure, even if the image sensor has many sensor elements, it is possible to realize a highly sensitive image sensor, which can readily make electric connection between each sensor element and amplification IC, and to provide a method of manufacturing the image sensor.

What is claimed is:

1. A method of manufacturing an image sensor comprising:

forming a stud bump on each electrode pad of the predetermined number of IC chips provided in a first substrate, the stud bump on each electrode pad including two or more bumps laminated together;

carrying out indium plating with respect to a second substrate;

transferring said plated indium to said second substrate to the distal end of each of said stud bump so that a plurality of thin film layers can be formed;

connecting each of said thin film layers with the electrode of each of sensor elements so that a sensor element array having the plurality of said sensor elements arrayed like two-dimensional matrix is mounted to each of IC chips of said first substrate by flip chip mounting; and injecting an insulating resin between said first substrate and said sensor element array, and thereafter, hardening said insulating resin.

2. The method of manufacturing said image sensor, according to claim 1, wherein each of said stud bump is made of gold, and each of said thin film layers is made of indium.

3. The method of manufacturing said image sensor, according to claim 1, wherein said sensor element is CdTe element.

4. The method of manufacturing said image sensor, according to claim 1, wherein each of the two or more bumps laminated has a projection-shape.

* * * * *